United States Patent [19]

Popek et al.

[11] Patent Number: 4,939,387

[45] Date of Patent: Jul. 3, 1990

[54] IMPULSE WAVEFORM DRIVE APPARATUS FOR SURFACE ACOUSTIC WAVE CHIRP SYSTEM

[75] Inventors: Marc H. Popek, Indian Harbour Beach; Pat O. Bentley, Palm Bay, both of Fla.

[73] Assignee: Harris Corporation, Melbourne, Fla.

[21] Appl. No.: 190,658

[22] Filed: May 5, 1988

[51] Int. Cl.$^5$ .................... H03K 5/159; H03C 3/00
[52] U.S. Cl. .................... 307/529; 307/261; 328/56; 328/59; 332/149; 333/150
[58] Field of Search ............ 307/529, 239, 262; 328/14, 16, 20, 160; 333/150, 154; 332/16 T, 31 T, 17, 37 R; 375/24, 41; 455/324

[56] References Cited

U.S. PATENT DOCUMENTS

| | | | |
|---|---|---|---|
| 3,772,584 | 11/1973 | Barley et al. | 328/20 |
| 3,969,590 | 7/1976 | Jain et al. | 333/150 |
| 4,288,750 | 9/1981 | Newton et al. | 328/55 |
| 4,329,651 | 5/1982 | Alsup | 328/14 |
| 4,398,153 | 8/1983 | Rittenbach | 328/16 |
| 4,602,226 | 7/1986 | Vatis | 332/31 R |
| 4,620,112 | 10/1986 | McPherson et al. | 307/239 |
| 4,633,185 | 12/1986 | McPherson et al. | 333/150 |
| 4,736,390 | 4/1988 | Ward et al. | 455/324 |

Primary Examiner—Stanley D. Miller
Assistant Examiner—Timothy P. Callahan
Attorney, Agent, or Firm—Evenson, Wands, Edwards, Lenahan & McKeown

[57] ABSTRACT

An amplitude modulation apparatus for achieving an extremely deep extinction ratio (in excess of −90 dBc) at nanosecond rise times required by an SAW device comprises the cascaded combination of a controlled switching device (GaAsFET), capable of providing a medium degree (40 dB) of attenuation at nanosecond switching rates, and a double balanced mixer, both multiplier input ports of which are coupled to receive split outputs from the GaAsFET switch. Because of the nonlinearity of the transfer function of the mixer when driven by the same RF carrier input at both multiplier ports, the output of the mixer is in excess of −90 dBc. In an SAW-based signal processing system, the output of the mixer is coupled to RF drive input of the SAW device. With the throughput functionality of the GaAsFET switch being precisely controlled to supply an integral number of half RF carrier frequency cycles to the double balanced mixer, the resultant waveform that is applied to the SAW device drive input from the mixer contains no energy at the RF carrier that could otherwise introduce unwanted Fresnel distortion.

9 Claims, 1 Drawing Sheet

IMPULSE WAVEFORM DRIVE APPARATUS FOR SURFACE ACOUSTIC WAVE CHIRP SYSTEM

The U.S. Government has rights in the present invention under Air Force Contract No. F30602-86-C-0091.

FIELD OF THE INVENTION

The present invention relates in general to acousto optic signal processing and is particularly directed to an apparatus for driving a surface acoustic wave device with an impulse function-representative signal.

BACKGROUND OF THE INVENTION

Multi-GHz bandwidth signal processing systems (e.g. radar return processors) commonly make use of acousto optic signal processing devices, such as surface acoustic wave (SAW) devices to spatially segregate signals in terms of frequency. Because of its dispersion characteristics and bandwidth, in order to provide an optimal chirp output signal, the SAW device should be driven with a signal that represents, as closely as possible, an impulse function centered at the resonant frequency of the SAW device. In terms of a practical drive signal, such a signal consists of an prescribed number of (RF) carrier cycles at the resonant frequency of the SAW device.

Because of the behavior of the SAW device, the characteristics of the impulse wave must be precisely defined, in order to minimize carrier leakage and consequential Fresnel distortion. As an illustration, for a center frequency 500 MHz, a SAW dispersion time of 3 microseconds and a bandwidth of 150 MHz, the optimum drive to the SAW device consists of exactly four complete cycles of the 500 MHz carrier with the first order sidelobe nulls spaced 150 MHz apart. The sidelobes are expanded in time by the SAW device over its 3 microsecond dispersion time. Any leakage of the carrier is integrated by the device and appears in the output as a constant frequency (tone), which interferes with the normally dispersed waveform and creates the unwanted Fresnel distortion.

The degree to which the carrier is extinguished in order to effectively suppress this distortion is proportional to the ratio of the carrier cycle time; in terms of the above parameters, 8 nanoseconds divided by the 3 microsecond period, corresponding to 60 dBc for a S/N of 1.0, which is far below typical S/N requirements of 30 dB, requiring an extinction ratio of at least 80 dBc.

Previous attempts to achieve high extinction ratios have included the individual use of mixers, analog switches, and impulse generators. A mixer, to the respective ports of which the RF signal and a pulse signal are applied, can support the requisite rise time, but cannot achieve an extinction ratio in excess of 30 dB. An analog switch, on the other hand, is capable of providing 70 dB of isolation, but is too slow to achieve the requisite rise time. Finally, an impulse generator spreads out the energy from DC to infinity in the frequency domain.

SUMMARY OF THE INVENTION

In accordance with the present invention the shortcomings of conventional mechanisms for supplying a well defined drive waveform to an SAW device are obviated by an amplitude modulation scheme that combines the beneficial properties of conventional signal coupling/processing components to achieve an extremely deep extinction ration (in excess of −90 dBc) at nanosecond rise times required by the SAW device. To this end, the present invention comprises the cascaded combination of a controlled switching device (GaAs-FET), capable of imparting a medium degree (40 dB) of attenuation at nanosecond switching rates, and a double balanced mixer, both multiplier input ports of which are coupled to receive split outputs from the GaAsFET switch. Because of the nonlinearity of the transfer function of the mixer when driven by the same RF carrier input at both multiplier ports, (as contrasted with the conventional application of an RF carrier to one port and an IF-defining baseband pulse signal to a second port), the output of the mixer is in excess of −90 dBc.

In an SAW-based signal processing system, the output of the mixer is coupled to RF drive input of the SAW device. With the throughput functionality of the GaAsFET switch being precisely controlled to supply a prescribed number of RF carrier frequency cycles at one-half the desired RF frequency, to the double balanced mixer, the resultant waveform that is applied to the SAW device drive input from the mixer contains no energy at the desired RF carrier that could otherwise introduce unwanted Fresnel distortion.

DETAILED DESCRIPTION

Figure 1:
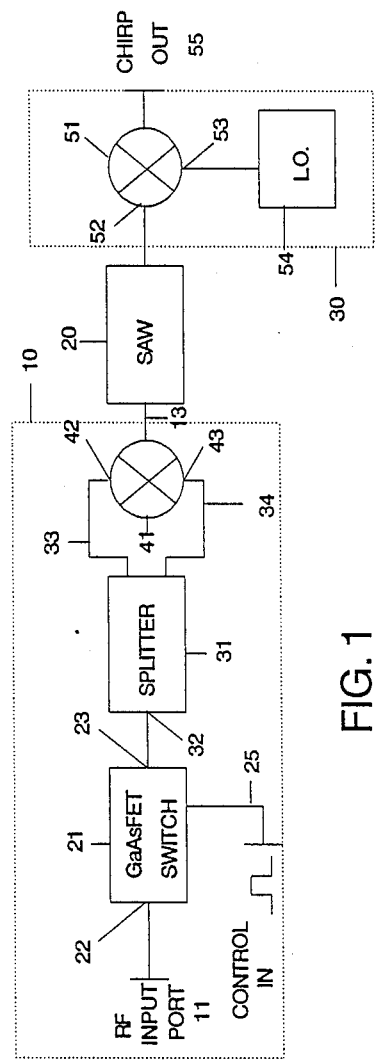
FIG. 1 is a diagrammatic illustration of the make-up of the amplitude modulator and its use in driving a surface acoustic wave RF chirp generator in accordance with the present invention.

Referring now to FIG. 1, there is shown a diagrammatic illustration of the make-up of the amplitude modulator and its use in driving a surface acoustic wave RF chirp generator in accordance with the present invention. The amplitude modulator is shown by broken lines 10 having a radio frequency carrier input port 11 and an output port 13, between which a controlled attenuator (switch 21) a signal splitter 31 and a double balanced mixer 41 are coupled in cascade. Specifically, controlled switch 21 preferably comprises a GaAsFET switch having an input 22, an output 23 and a control port 25 to which a switching pulse, the width of which defines the number of cycles of the RF carrier signal to be coupled to output port 23, is supplied. The gated RF carrier signal supplied at the output 23 of switch 21 is coupled to the input 32 of a signal splitter 31, respective outputs 33 and 34 of which are coupled to the two symmetric inputs of 42 and 43 of double balanced mixer 41. The output of mixer 41 is coupled to the output port 13 of the amplitude modulator 10 and supplied as a drive input to a surface acoustic wave device 20 (SAW).

In response to the drive input from mixer 41, SAW 20 produces a multiplicity of spaced apart output frequencies occupying a bandwidth defined by the frequency of input carrier 11 and the width of the gating pulse supplied to switch 21. This respective set of output frequencies is then applied to a downstream mixer 51 within chirp generator 30, to a second input 53 of which the output of a local oscillator 54 is applied. Mixer 51 produces, at output 55, an IF chirp signal defined by the multiplication of the output of the local oscillator 54 and the swept set of frequencies produced by SAW device 20.

Operation

An understanding of the operation of the present invention may be facilitated by reference to FIGS. 2-5, which show respective waveforms at successive signal processing locations within the system shown in FIG. 1.

Figure 2:
FIGS. 2-5 show respective waveforms at successive signal processing locations within the system of FIG. 1.
Figure 3:
Figure 4:
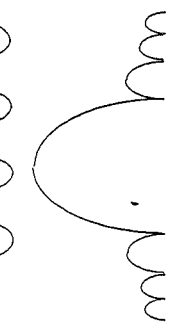
Figure 5:

In particular, in FIG. 1 a constant frequency RF carrier is supplied to input port 11 of AM modulator 10, which is coupled to input 22 of GaAs FET switch 21. FIG. 2 shows a gating pulse of a prescribed duration which is coupled to the control port 25 of GaAsFET switch 21. FIG. 3 illustrates the resultant output of the GaAsFET switch 21 in response to the controlled gating pulse supplied to control port 25 and its effect on RF carrier input applied to port 11. As shown in FIG. 3, a prescribed integral number (in the example shown four) of cycles of the RF carrier input are supplied from output port 23 and coupled to splitter 31. Splitter 31 divides the gated carrier supplied from switch 21 (with a 3 dB attenuation) to inputs 42 and 43 of a double balanced mixer 41.

As mentioned previously, conventional use of a double balanced mixer involves the application of a carrier to one input port and a baseband local oscillator to the other port of the mixer to produce an IF output. In accordance with the present invention, both multiplier inputs of the mixer 41 receive the (gated) RF carrier to result in the production of a modified impulse response illustrated in FIG. 4 at the output port 13 of AM modulator 10. Because of the extremely rapid switching times that are available with a GaAsFET switch 21 and the rise time achievable by the operation of double balanced mixer 41, there is effectively no carrier present in the modified impulse waveform, shown in FIG. 4, produced at the output port 13 of the AM modulator 10. As a consequence, there is no carrier leakage which would produce the unwanted distortion tone through the SAW device (20). SAW device 20, consequently, produces its intended distribution of spaced-apart frequencies, diagrammatically illustrated in FIG. 5. By the application of the spaced-apart 1 set of frequencies to a downstream mixer 51, an multiplying the same by the output of a local oscillator 54, output port 55 produces an IF chirp.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. An apparatus for controlling characteristics of a signal applied thereto comprising:
   an input port to which a signal, characteristics of which are to be controlled, is applied;
   an output port;
   switch means having an input coupled to said input port and an output, for controllably passing therethrough and interrupting the transmission of a signal applied to said input port to its output; and
   a mixer having first and second inputs coupled to the output of said switch means and an output coupled to said output port.

2. An apparatus according to claim 1, wherein said signal comprises a radio frequency signal and further including a surface acoustic wave device coupled to said output port, said surface acoustic wave device producing a chirp signal output in response to said switch means being controlled to pass an RF signal therethrough for a prescribed period of time.

3. An apparatus according to claim 2, further including control means, coupled to said switch means, for controlably enabling said switch means to pass therethrough effectively only a prescribed number of cycles of said radio frequency signal.

4. An apparatus according to claim 1, wherein said mixer comprises a double balanced mixer.

5. An amplitude modulation apparatus comprising
   an input port for receiving an input oscillation signal;
   an output port from which an amplitude modulated output signal is to be derived;
   a controlled switch means, having an input coupled to said input port and an output, for controllably passing therethrough a prescribed portion of said input oscillation signal; and
   means for multiplying said prescribed portion of said input oscillation signal controllably passed through said controlled switch means by itself and coupling the resultant product as an amplitude modulation signal to said output port.

6. An amplitude modulation apparatus according to claim 5, wherein said multiplying means comprises a double balanced mixer.

7. An amplitude modulation apparatus according to claim 6, wherein said oscillation signal comprises a radio frequency signal and further including a surface acoustic wave device coupled to said output port.

8. An amplitude modulation apparatus according to claim 7, further including control means, coupled to said controlled switch means, for causing said switch means to controllably pass therethrough only an integral number of cycles of said radio frequency signal, thereby causing said multiplying means to apply to said surface acoustic wave device a modified impulse function signal centered at the resonant frequency of said surface acoustic wave device.

9. A radio frequency signal processing apparatus comprising, in combination:
   an input port to which a radio frequency signal is applied;
   controlled switch means, having an input coupled to said input port, an output and a control port to which a control signal for causing said switch means to pass therethrough only an integral number of cycles of said ratio frequency signal to said output;
   a double balanced mixer having first and second inputs, each of which is coupled to receive the integral number of cycles of said radio frequency signal passed through said controlled switch means, and an output; and
   a surface acoustic wave device having an input coupled to the output of said double balanced mixer and an output coupled to said output port.

* * * * *